United States Patent
Stansfield et al.

(10) Patent No.: US 6,859,084 B2
(45) Date of Patent: Feb. 22, 2005

(54) LOW-POWER VOLTAGE MODULATION CIRCUIT FOR PASS DEVICES

(75) Inventors: Anthony I. Stansfield, Bristol (GB); Alan D. Marshall, Bristol (GB)

(73) Assignee: Elixent Ltd., Bristol (GB)

( * ) Notice: Subject to any disclaimer, the term of this patent is extended or adjusted under 35 U.S.C. 154(b) by 0 days.

(21) Appl. No.: 10/224,093

(22) Filed: Aug. 19, 2002

(65) Prior Publication Data

US 2004/0032289 A1 Feb. 19, 2004

(51) Int. Cl.$^7$ ................................................. H03K 5/08
(52) U.S. Cl. ...................... 327/325; 327/321; 327/327
(58) Field of Search ..................... 365/185.23, 185.18, 365/185.29; 327/321, 325, 327, 331, 308, 333, 318, 319; 326/81, 84

(56) References Cited

U.S. PATENT DOCUMENTS

| | | | | |
|---|---|---|---|---|
| 4,926,070 A | * | 5/1990 | Tanaka et al. | 326/81 |
| 5,684,415 A | * | 11/1997 | McManus | 326/81 |
| 5,767,728 A | | 6/1998 | Michail et al. | 327/374 |
| 5,828,231 A | * | 10/1998 | Bazargan | 326/81 |
| 5,894,227 A | | 4/1999 | Acuff | 326/68 |
| 6,118,303 A | * | 9/2000 | Schmitt et al. | 326/83 |
| 6,208,171 B1 | | 3/2001 | Kumagai et al. | 326/121 |
| 6,285,213 B1 | | 9/2001 | Makino | 326/81 |
| 6,356,481 B1 | * | 3/2002 | Micheloni et al. | 365/185.23 |

FOREIGN PATENT DOCUMENTS

| | | |
|---|---|---|
| JP | 59-208926 | 11/1984 |
| JP | 62-136914 | 6/1987 |
| JP | 62 178015 | 8/1987 |

OTHER PUBLICATIONS

"108 Appendix B—FPGA Circuitry and Process Modeling—B.1.1 FPGA Routing Structures", Architecture and CAD for Deep–Submicron FPGA, (Betz, Rose and Marquardt), Kluwer–Academic Publisher, 1999.

* cited by examiner

*Primary Examiner*—My-Trang Nu Ton
*Assistant Examiner*—Hiep Nguyen
(74) *Attorney, Agent, or Firm*—Orrick, Herrington & Sutcliffe LLP

(57) ABSTRACT

Power supply voltages are selectively modulated to correspond with degraded input voltages to a logic device. Modulated power supply voltages are provided to transistors within the logic device, so that the degraded input voltages supplied to the transistors are sufficient to turn the transistors substantially on or off. Leakage currents are prevented thereby from flowing across the transistors.

36 Claims, 6 Drawing Sheets

LOW-POWER VOLTAGE MODULATION CIRCUIT FOR PASS DEVICES

BACKGROUND AND SUMMARY

The invention relates to semiconductor devices. More particularly the invention relates to improvements in the switchable routing networks used in many semiconductor devices to route signals across the device.

Throughout the specification, P and N-channel MOS (metal oxide semiconductor) devices (PMOS and NMOS) are described in terms of their respective gate, drain and source nodes to help clarify the structure and operation of the alternative embodiments. PMOS devices transmit positive current when the signal on the gate is low, and cease transmitting current when the signal on the gate is high. NMOS devices transmit positive current when the signal on the gate is high, and cease transmitting positive current when the signal on the gate is low.

According to standard convention, positive current flows from the drain to the source node in NMOS devices, and flows from the source to the drain in PMOS devices. The source and drain node conventions are used only to help describe the structure and operation of embodiments of the invention and are not intended to limit the scope of the invention. It is possible to operate MOS transistors in reverse, especially if the source and drain regions are symmetrical. As such, the relative positions of the drain and source are not critical to the disclosed embodiments of the invention.

Turning to FIG. 12, many semiconductor devices are composed of a number of processing elements 10 connected via a configurable routing network 20. For example, reconfigurable devices, such as field programmable gate arrays ("FPGAs"), processor arrays and reconfigurable arithmetic arrays ("RAAs"), normally include a number of processing elements connected together by a general-purpose interconnect network capable of making links between various combinations of processing elements. Similarly, integrated devices include several processors, peripherals and memories connected via one or more shared busses. FIG. 12 depicts a portion of such a semiconductor device. The semiconductor device of FIG. 12 includes additional processing elements, which are omitted from FIG. 12 in order to clearly show the details of the circuit. It is sometimes useful to provide input buffer circuits 80 between the configurable routing network 20 and the processing elements 10. These input buffer circuits 80 can be buffers that simply propagate an input value, or simple logic devices such as CMOS inverters, NAND gates, or NOR gates, or can be more complex circuits adapted to perform various functions as desired by the designer of the semiconductor device.

The configurable routing network 20 carries signals from one processing element 10 to another. The signals proceed from the processing device outputs 12 of the various processing elements 10 across the configurable routine network 20 to the processing device inputs 15 of the various processing elements 10. For CMOS circuits these signals are typically a series of binary values, expressed as either a high voltage corresponding to a logic "1" and normally equal to $V_{dd}$, the positive supply voltage 60, or a low voltage, corresponding to a logic "0" and normally equal to Gnd, the ground supply voltage 70.

The routing network 20 typically comprises a set of wire segments 30 and a set of active devices, configured as switches 40, that can make or break connections between the wire segments 30. By selectively making and breaking connections between wire segments 30, the routing network 20 is capable of making a variety of connections between the various processing elements 10 on the device. The switches 40 at the top and bottom of FIG. 12 provide connections to the additional processing elements which are not shown in FIG. 12. These connections can be dynamically varied as the requirements of the processing elements 10 change. The switches 40 are controlled by signals on the control wires 50, typically by the state of the device they are part of, or sometimes by the state of another device.

There are various types of switches 40 that can be used in switchable routing networks. One type of switch 40 that is useful in designing routing networks is a single transistor, known as a pass transistor, with its source and drain connected to a pair of the wire segments 30 in the routing network. Pass transistors are a good choice because they do not take up much space on the semiconductor device, they can propagate signals across the wire segments 30 in either direction, and they do not consume very much power, because there are no active circuits in the routing path. Power is only used to charge and discharge the wire segments 30.

However, implementing the switches 40 as pass transistors also suffers from a disadvantage. Depending on the type of pass transistor used, either the highest voltage that can propagate through the pass transistor is less than the gate voltage (normally $V_{dd}$ to turn on an NMOS transistor), or the lowest voltage that can propagate through the pass transistor is greater than the gate voltage (normally Gnd to turn on a PMOS transistor). For an NMOS pass transistor, the reduced high signal is lower than the gate voltage by an amount equal to the threshold voltage $V_t$ of the transistor, yielding a reduced high signal $V_{dd}-V_t$. For a PMOS pass transistor, the increased low signal is greater than the gate voltage by an amount equal to the absolute value of the threshold voltage $V_t$ of the transistor, yielding an increased low signal of Gnd$-V_t$. (PMOS transistors by convention have negative threshold voltages, so Gnd$-V_t$ is greater than Gnd.) Therefore an undegraded signal varying between $V_{dd}$ and Gnd will be degraded as it propagates through a pass transistor. Other active devices may similarly alter either the high or low signals, depending on the active device. Because of this voltage alteration effect of the pass transistors, logic devices such as the input buffer circuits 80 which receive the signals sent through the pass transistors receive signals that may not be high enough or low enough to guarantee to turn the transistors within the logic devices on or off.

For example, if a reduced high signal from an NMOS pass transistor is provided to the gate of a PMOS transistor, in an input buffer circuit 80, that has the positive supply voltage $V_{dd}$ provided on the source, then the reduced high signal will be insufficient to turn the PMOS transistor fully off, and some current will leak through the PMOS transistor. Similarly, if an increased low signal is provided to the gate of an NMOS transistor, in an input buffer circuit 80, that has the ground voltage Gnd provided on the source, then the increased low signal will be insufficient to turn the NMOS transistor fully off, and some current will leak through the NMOS transistor. This phenomenon is not unique to pass transistor switches in routing networks. Similar issues arise anytime a high signal is reduced or a low signal is increased as it is propagated across any active or powered device (e.g. transistors, rectifiers, amplifiers, etc.).

Various means have been used to attempt to resolve the voltage alteration problem caused by active devices such as the pass transistors in a routing network. For example, the reduced high signal on the output of the pass transistor can be raised to a level high enough to ensure that other devices attached to the output of the pass transistor can be turned on or off, by reducing the threshold voltage $V_t$ of the pass transistor.

In order to reduce $V_t$, a more complex process of creating the silicon substrate is required. It is possible to design devices with a lower $V_t$, but an extra processing stage is required. Additionally, this extra step typically means that the lower $V_t$ elements have to be physically spaced further from the normal $V_t$ elements, which consumes valuable space on the silicon. Also, a lower $V_t$ means that there is a stronger leakage current when the transistor is switched off, which wastes power.

Another solution to the voltage alteration problem is to use a level-restoring circuit to pull the reduced high signal back up to the high signal, or pull the increased low signal back down to the low signal. There are two popular types of circuits for restoring voltages. First a circuit known as a "weak pull-up" circuit can be used to pull up a reduced high signal (similarly a weak pull-down can pull down an increased low signal.) Second, a differential amplifier circuit can be used to push both reduced high and increased low signals to the respective high or low values.

The circuit of FIG. 1 is an example of a weak pull-up circuit. The circuit of FIG. 1 is shown using an inverter 140 as the logic device to which the reduced high signal is provided. The weak pull-up circuit functions similarly for other devices such as NAND gates. Weak pull-up circuits, however, are not useful for devices such as NOR gates. In order for a weak pull-up to be useful, the output of the gate must be low if and only if the input to which the pull-up is attached is high. This condition is met for inverters and NAND gates, but not NOR gates—the NOR output could be low if the other input was high.

The inverter 140 requires a high signal equal to $V_{dd}$ in order to be certain of being fully activated. A reduced high signal is received on the input 110. This reduced high signal is propagated to the inverter 140, which causes the inverter 140 to emit the inverse of this reduced high signal, an increased low signal somewhere above the low signal (the low signal being equal to Gnd). This increased low signal is passed to the gate of the PMOS transistor 130, which causes the PMOS transistor 130 to turn on. The PMOS transistor 130 is then able to pull the input 110 up to the full $V_{dd}$ level present on the positive voltage supply input 120. Thus, the reduced high signal on the input 110 is pulled up to the full $V_{dd}$ level and the inverter 140 is fully activated, propagating the full low voltage Gnd to the output 150. Alternatively, an increased low signal on the input 110 can be pulled down to a full low voltage Gnd by replacing the PMOS transistor 130 with an NMOS transistor, and replacing the $V_{dd}$ voltage on the positive voltage supply input 120 with a Gnd voltage.

This circuit has a significant drawback, however. Selecting the proper strength of the transistor 130 is important for efficient operation of the circuit, yet non-trivial. Transistor strength is a measurement of the resistance of the transistor when it is conducting current. Strong transistors conduct a greater current than weak transistors. If the transistor 130 is too weak, then it takes a long time for the transistor 130 to pull the input all the way up (or down for NMOS pull down transistors), during which time the inverter 140 is dissipating power. If the transistor 130 is too strong, then it takes time for the driving circuit to pull against the transistor when trying to drive a low onto the input 110 in order to flip the inverter, or for an NMOS pull down transistor when trying to drive a high onto the input 110. The need to pull against the resistive load from the transistor 130 also increases power dissipation.

Selecting the proper strength for the transistor is especially difficult in reconfigurable arrays, since the optimal strength is dependent on the resistance of the path through the array from the original source of the signal to the device targeted by the signal. Since the array is reconfigurable, this path is variable in length depending on the application configured onto the array, and thus the resistance is variable, not constant. Therefore the only way to select a safe value for the pull-up transistor is to use a value that is safe for the worst case path—i.e. a value that is guaranteed to be sub-optimal for the vast majority of paths. The safe value is a value that is weak enough that its resistance can always be overcome by any path through the array.

Another solution is the differential amplifier circuit shown in FIG. 2. In this circuit, the input signal on the input 210 is compared with a reference signal $V_{ref}$ on the reference input 280. $V_{ref}$ is selected to be halfway between the high signal and the low signal that propagate through the routing network. The positive voltage supply input 220 supplies the positive supply voltage $V_{dd}$ to the two PMOS transistors 230, 240. The ground voltage supply input 270 supplies the ground supply voltage Gnd to the two NMOS transistors 250, 260. The drains of the two PMOS transistors 230, 240 connect to the ground 270, via the two NMOS transistors 250, 260. The drains of each of the two PMOS transistors 230, 240 also connect to the gate of the other PMOS transistor. The first NMOS transistor 250 is controlled by the input signal on the input 210. The second NMOS transistor 260 is controlled by the $V_{ref}$ signal on the reference input 280. Finally, the output 290 is connected to the drain of the second PMOS transistor 240.

The differential amplifier is constructed such that the two PMOS transistors 230, 240 will not both normally be on simultaneously. If one of the two PMOS transistors 230, 240 has a low drain voltage it will turn the other on, and thereby cause the other's drain voltage (and its own gate voltage) to be high, turning itself off and ensuring that its own drain voltage remains low. The drain voltages are controlled by the NMOS transistors 250, 260 trying to pull down the voltage to Gnd. Whichever of the two NMOS transistors 250, 260 has a higher signal on its gate will pull down more strongly, forcing a lower voltage onto the drain of the corresponding PMOS transistor 230, 240 and consequently turning on the other PMOS transistor. Therefore, if the signal on the input 210 is less than the $V_{ref}$ signal on the reference input 280, then the first PMOS transistor 230 is turned on, the second PMOS transistor 240 is turned off, and the output 290 goes down to Gnd. If the signal on the input 210 is greater than the $V_{ref}$ signal on the voltage input 280, then the second PMOS transistor 240 is turned on, the first PMOS transistor 230 is turned off, and the output 290 goes up to $V_{dd}$. Thus, since $V_{ref}$ is selected to be halfway between the high and low input signal levels, any input signal which is closer to a high than a low results in an output equal to $V_{dd}$, and any input signal that is closer to a low than a high results in an output equal to Gnd.

This circuit, however, wastes power, because of the resistive paths from $V_{dd}$ to Gnd across the transistors 230, 240, 250, 260. Since the second NMOS transistor 260 is always partially conducting, there is a constant power drain through the amplifier whenever the output 290 is high. The extra power consumption of the differential amplifier circuit compromises the power benefits of using a pass transistor network in the first place.

Therefore, systems are needed to easily and optimally compensate for the effects of the routing network on the voltages propagated through the network, without increasing power dissipation in the semiconductor device, and with a small number of additional components.

BRIEF DESCRIPTION OF THE DRAWINGS

The accompanying drawings are included to provide a further understanding of embodiments of the invention and together with the Detailed Description, serve to explain the principles of the embodiments disclosed.

DETAILED DESCRIPTION OF THE PREFERRED EMBODIMENTS

Figure 3:
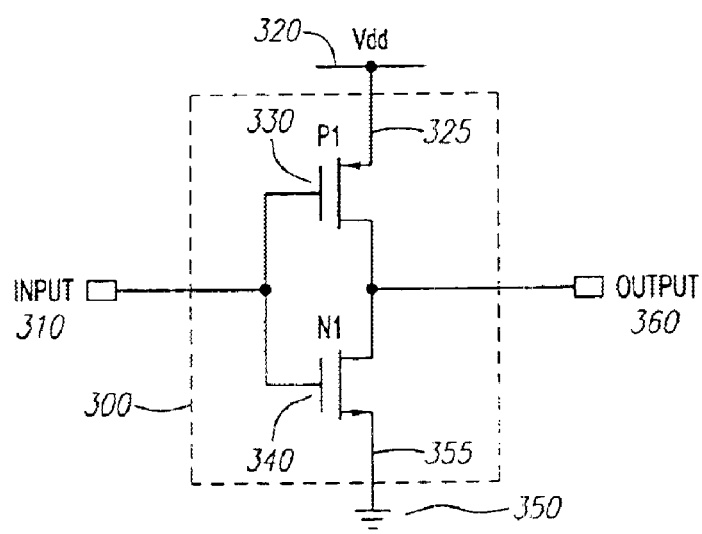
FIG. 3 is a depiction of an inverter implemented in CMOS logic.
Figure 12:
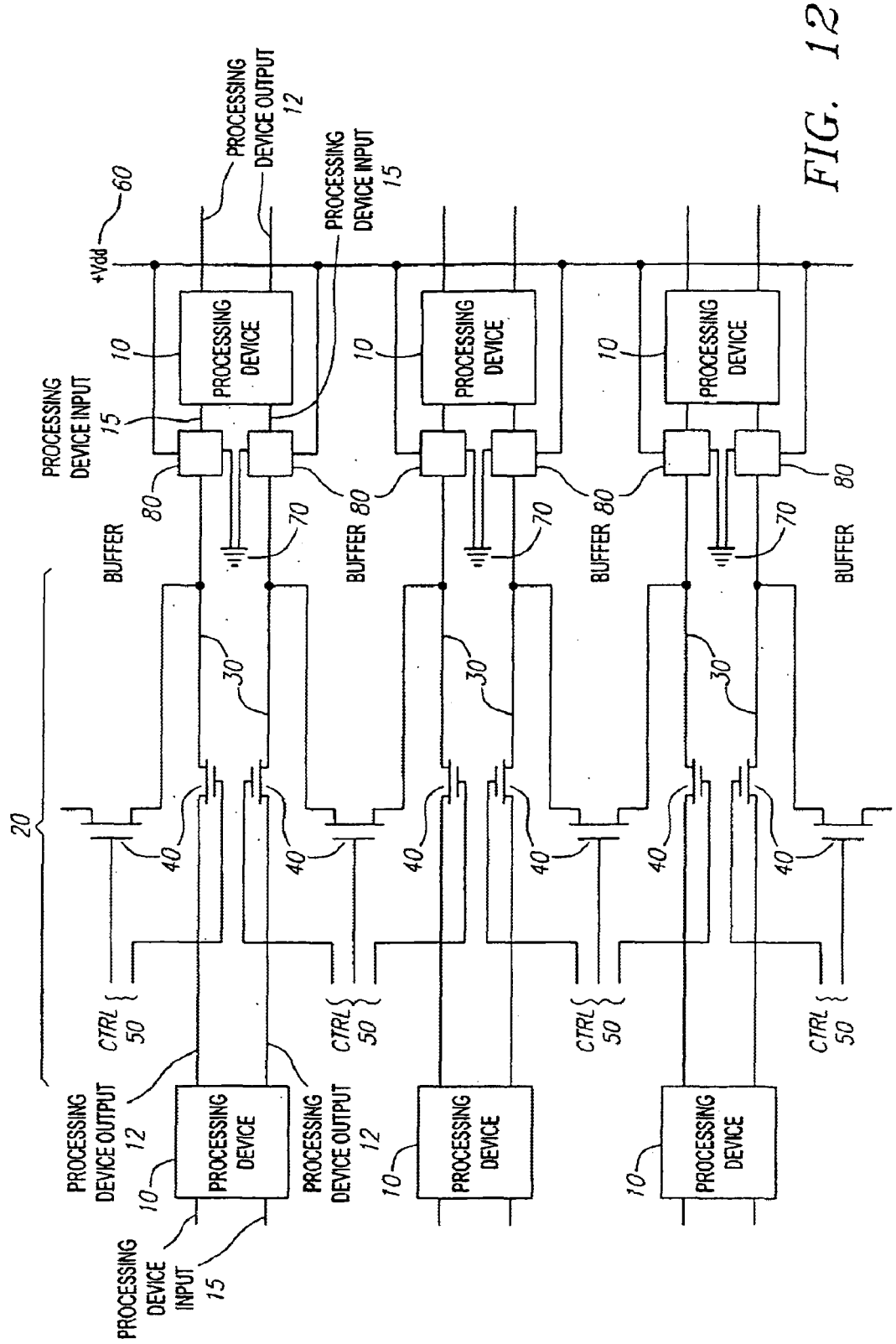
FIG. 12 is a depiction of a reconfigurable device.

Turning to FIG. 3, an example CMOS logic device is shown. The logic device of FIG. 3 is an inverter 300, but those skilled in the art will appreciate that the embodiments disclosed herein can be used with any standard logic devices or any combinations of standard logic devices. With reference to FIG. 12, the inverter 300 may be, for example, a component of an input buffer circuit 80 on a reconfigurable device. For purposes of simpler discussion, the disclosed embodiments are discussed with reference to CMOS logic devices. Other embodiments using other forms of logic devices are also possible. The CMOS inverter shown in FIG. 3 is connected to an input 310, a positive voltage supply 320, a ground voltage supply 350 and an output 360. The positive voltage supply 320 supplies power at a high CMOS voltage $V_{dd}$, which is also used as the voltage to represent a high value (logic "1") to CMOS logic devices. The ground voltage supply 350 provides a ground value Gnd, also used as the voltage to represent a low value (logic "0") to CMOS logic devices. The inverter 300 includes a positive voltage supply input 325, a first PMOS transistor 330, a first NMOS transistor 340 and a ground voltage supply input 355.

The inverter 300 operates to propagate the inverse of the signal on the input 310 through the output 360. If the signal on the input 310 is a low value (i.e. Gnd, CMOS low, etc.) then the first PMOS transistor 330 is turned on, allowing current to flow from the positive voltage supply 320 through the positive voltage supply input 325 to the output 360. This sends the high signal to the output 360. The first NMOS transistor 340 is turned off by the low signal, and the path to the ground voltage supply 350 is therefore blocked, preventing current from flowing to the ground voltage supply 350. If the signal on the input 310 is a high value (i.e. $V_{dd}$, CMOS high, etc.), then the first PMOS transistor 330 is turned off, preventing current from flowing from the positive voltage supply 320. The first NMOS transistor 340 is turned on by the high value, thus causing the output 360 to be connected through the ground voltage supply input 355 to the ground voltage supply 350. This sends the low signal to the output 360.

Figure 4:
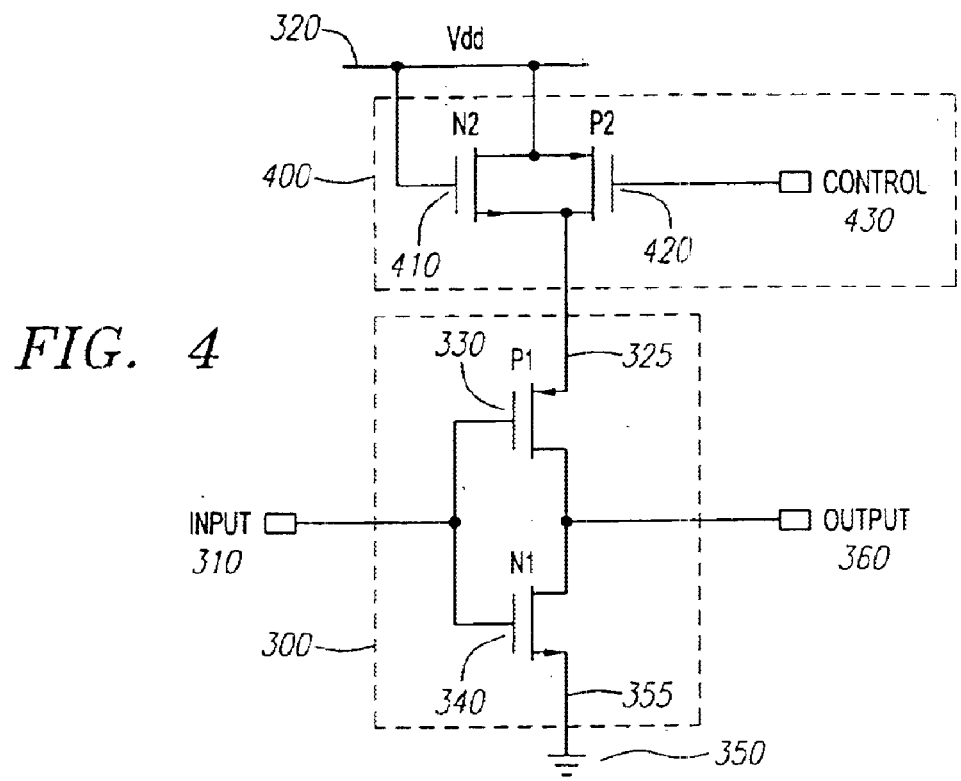
FIG. 4 is a depiction of a voltage modulation circuit connected to the positive voltage supply input of the inverter of FIG. 3, according to an embodiment of the invention.

A voltage modulation circuit 400 is used in conjunction with a target circuit such as the inverter 300 to provide a high and/or low output signal, as shown in FIG. 4. The voltage modulation circuit 400 is connected between the positive voltage supply 320 and the positive voltage supply input 325 of the inverter 300, such that power supplied to the inverter 300 is first routed through the voltage modulation circuit 400, and then provided to the inverter 300. Since the voltage modulation circuit 400 is placed between the positive voltage supply 320 and the positive voltage supply input 325 of the inverter 300, no additional current paths are created, other than the already existing path created by the inverter 300. Therefore, the voltage modulation circuit 400 creates no additional source of power dissipation beyond that already existing in the inverter 300.

The voltage modulation circuit 400 includes a converter and a bypass circuit. In an embodiment, the converter is a second NMOS transistor 410, and the bypass circuit is a second PMOS transistor 420. In alternate embodiments, the converter is composed of other types of devices, such as one or more other types of transistors, diodes or other devices which convert the voltage on the positive voltage supply 320 to a reduced level useful to ensure that the first PMOS transistor 330 is turned off, even where the signal on the input 310 is a reduced high signal. In alternative embodiments, the bypass circuit is composed of other types of devices, such as one or more switches or other devices which selectably control the signal presented to the inverter 300 between the high value and the reduced high value.

The positive voltage supply 320 is connected to both the gate and the drain of the second NMOS transistor 410, as well as to the source of the second PMOS transistor 420. The control input 430 is connected to the gate of the second PMOS transistor 420. The source of the second NMOS transistor 410 and the drain of the second PMOS transistor 420 are both connected to the positive voltage supply input 325 of the inverter 300.

Figure 1:
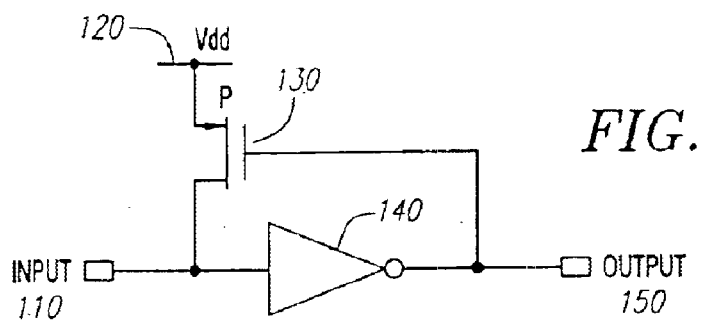
FIG. 1 is a depiction of a weak pull-up circuit.
Figure 2:
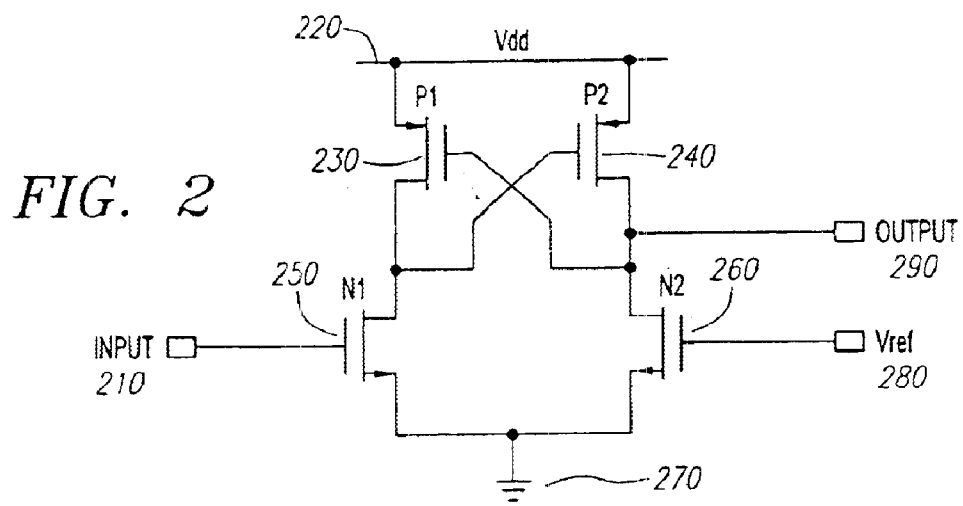
FIG. 2 is a depiction of a differential amplifier.

When the inverter 300 is in normal operation, the signal on the input 310 alternates between a low value and a reduced high value. When the input signal is a low value, the control input 430 is adapted to provide a low value to the second PMOS transistor 420. When the input signal is a reduced high value, the control input 430 is adapted to provide a high value to the second PMOS transistor 420. These control input values can be derived by inverting the signal on the output 360, or from any other available source of a signal which is the inverse of the output signal. More generally for any logic device, the control input values are configured such that the second PMOS transistor 420 is off (i.e. the control input high) whenever there is no conductive path through the PMOS transistors in the logic device, and such that the second PMOS transistor 420 is on (control low) whenever there is a conductive path through the PMOS transistors in the logic device. For a standard CMOS gate (where there is a path through either the NMOS or the PMOS devices, but not both simultaneously) the "PMOS conduct" state equates to a high signal on the output, and the "PMOS don't conduct" state equates to a low signal on the output. Therefore the value of the control signal is the inverse of the output signal. Since the voltage modulation circuit 400 connects to the supply connection to the CMOS gate, and not to the individual data inputs to the CMOS gate (e.g. the input 310), it is not always necessary for the control input 430 to track the input 310. This is a difference from the weak pull-up circuit of FIG. 1, which does try to control the individual inputs, so requires a control signal for the pull-up that is low when the input is high, and therefore only works for gates where the required control signal can be provided. The circuit of FIG. 1 is not applicable to a NOR gate for example, whereas the circuit of the embodiment of the present invention shown in FIG. 4 is applicable to any CMOS gate.

When the input signal is a low value and the control input 430 therefore provides a low value to the second PMOS transistor 420, the second PMOS transistor 420 propagates the full voltage $V_{dd}$ from the positive voltage supply 320 to the positive voltage supply input 325. This full voltage $V_{dd}$ overrides the reduced voltage being propagated through the second NMOS transistor 410. Thus, the control signal on the control input 430 operates to select the second PMOS transistor 420 to provide the full positive supply voltage $V_{dd}$ to the positive voltage supply input 325.

Since the input signal is a low value, the first PMOS transistor 330 supplies $V_{dd}$ from the positive voltage supply input 325 to the output 360. The first NMOS transistor 340 is turned off by the low value, thus there is no current path to the ground voltage supply 350 through the transistor 340. Therefore, a full CMOS high signal is provided on the output 360 of the inverter 300.

When the input signal is a reduced high signal and the control input 430 therefore provides a high signal to the second PMOS transistor 420, the second PMOS transistor 420 is turned off, thereby blocking the current flow through the second PMOS transistor 420. There is still a connection to the positive voltage supply 320 through the second NMOS transistor 410, however, since the gate of the second NMOS transistor 410 is connected to $V_{dd}$ and the second NMOS transistor 410 is therefore always conducting. Recall that NMOS transistors cannot propagate a high signal greater than their gate voltage less their threshold voltage. The best an NMOS transistor can do is propagate a reduced high signal, in this case $V_{dd}-V_{t(N2)}$, where $V_{t(N2)}$ is the threshold voltage of the second NMOS transistor 410. This reduced high signal is provided to the positive voltage supply input 325. Thus the control signal on the control input 430 operates to select the second NMOS transistor 410 to provide the reduced high signal to the positive voltage supply input 325.

The positive voltage supply input signal is a reduced high value of $V_{dd}-V_{t(N2)}$, and the input signal from the input 310 is a reduced high value of $V_{dd}-V_{t(pass)}$ (where $V_{t(pass)}$ is the threshold voltage of the device or devices through which the input signal is connected to the input 310). Thus, assuming that the second NMOS transistor 410 is selected such that it has a threshold voltage substantially equivalent to the threshold voltage of the device or devices connected to the input 310, the input signal and the positive voltage supply input signal are substantially the same voltage, the gate-source voltage differential across the first PMOS transistor 330 is therefore substantially zero, and the first PMOS transistor 330 is turned off. Exact equivalence between $V_{t(N2)}$ and $V_{t(pass)}$ is not necessary, the requirement is that the gate-source voltage is such as to guarantee that negligible current flows through the first PMOS transistor 330. This condition is typically met if the gate-source voltage is more than $\frac{1}{2}V_{t(P1)}$. This equates to a requirement that $V_{t(N2)}-V_{t(pass)} >= \frac{1}{2}V_{t(P1)}$. (Recall that PMOS transistors are turned on by a sufficiently low gate voltage and off by a high gate voltage.)

There is no leakage current through the first PMOS transistor 330, even though the positive voltage supply 320 is providing a full $V_{dd}$ voltage, because the full $V_{dd}$ voltage signal is converted to the reduced high signal by the second NMOS transistor 410. The reduced high signal on the input 310 is still strong enough to overcome the threshold voltage on the first NMOS transistor 340, thereby turning it on, and the signal on the output 360 is thus pulled to Gnd by the ground voltage supply 350. Therefore, a full CMOS low is provided on the output 360 of the inverter 300.

Figure 5:
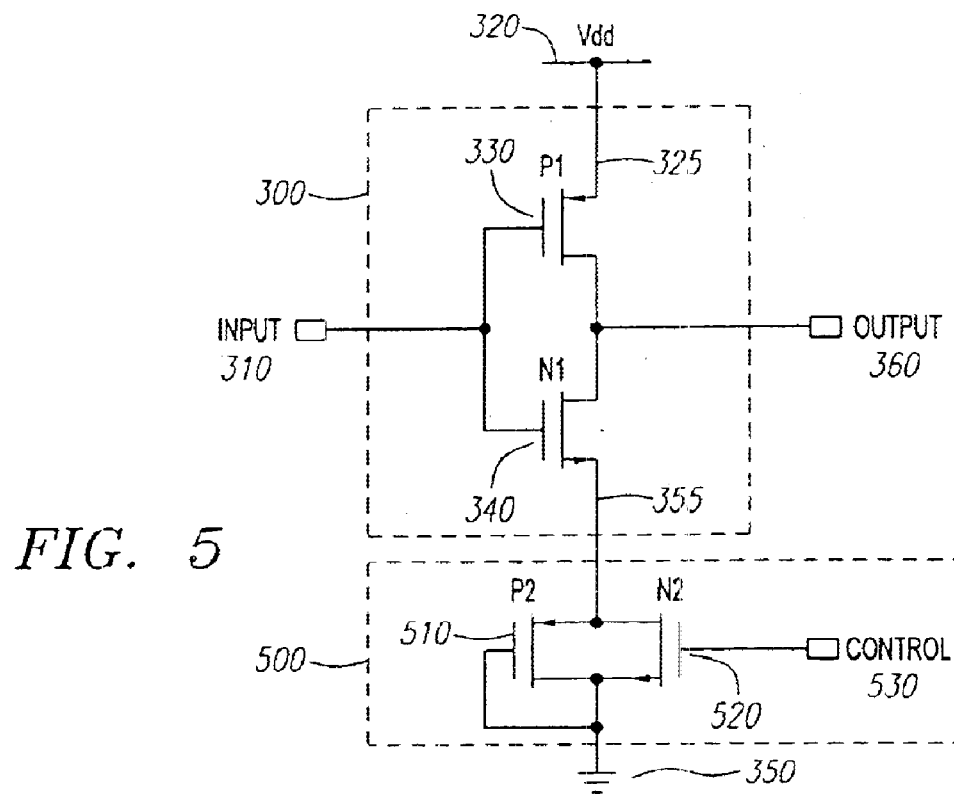
FIG. 5 is a depiction of a voltage modulation circuit connected to the ground of the inverter of FIG. 3, according to a second embodiment of the invention.

In a second embodiment shown in FIG. 5, a modified form of the voltage modulation circuit is used to handle situations where the input 310 can provide high signals, but can only provide increased low signals, not low signals. A second voltage modulation circuit 500 is used in conjunction with the inverter 300 to provide a high and/or low output signal. The second voltage modulation circuit 500 is connected between the ground voltage supply 350 and the ground voltage supply input 355 of the inverter 300, such that current drawn from the inverter 300 is first routed through the second voltage modulation circuit 500 and then to the ground voltage supply 350. Since the second voltage modulation circuit 500 is placed between the ground voltage supply 350 and the ground voltage supply input 355 of the inverter 300, no additional current paths are created, other than the already existing path created by the inverter 300. Therefore, the second voltage modulation circuit 500 creates no additional source of power dissipation beyond that already existing in the inverter 300.

The second voltage modulation circuit 500 includes a converter and a bypass circuit. In an embodiment, the converter is a third PMOS transistor 510, and the bypass circuit is a third NMOS transistor 520. In alternate embodiments, the converter is composed of other types of devices, such as one or more other types of transistors, diodes or other devices which convert the low signal on the ground voltage supply 350 to an increased low level useful to ensure that the first NMOS transistor 340 is turned off, even where the signal on the input 310 is an increased low signal. In alternative embodiments, the bypass circuit is composed of other types of devices, such as one or more switches or other devices which selectably control the voltage provided to the inverter 300 between the low value and the increased low value.

The ground voltage supply 350 is connected to both the gate and the drain of the third PMOS transistor 510, as well as to the source of the third NMOS transistor 520. The second voltage modulation circuit 500 also includes a control input 530, connected to the gate of the third NMOS transistor 520. The source of the third PMOS transistor 510 and the drain of the third NMOS transistor 520 are both connected to the ground voltage supply input 355 of the inverter 300.

When the inverter 300 is in normal operation, the signal on the input 310 alternates between an increased low value and a high value. When the input signal is a high value, the control input 530 is adapted to provide a high value to the third NMOS transistor 520. When the input signal is the increased low value, the control input 530 is adapted to provide a low value to the third NMOS transistor 520. These control input values can be derived by inverting the signal on the output 360, or from any other available source of a signal which is the inverse of the output signal. More generally for any logic device, the control input values are configured such that the third NMOS transistor 520 is off (i.e. the control input low) whenever there is no conductive path through the NMOS transistors in the logic device, and such that the third NMOS transistor 520 is on (control high) whenever there is a conductive path through the NMOS transistors in the logic device. For a standard CMOS gate (where there is a path through either the NMOS or the PMOS devices, but not both simultaneously) the "NMOS conduct" state equates to a low signal on the output, and the "NMOS don't conduct" state equates to a high signal on the output. Therefore the value of the control signal is the inverse of the output signal. Since the second voltage modulation circuit 500 connects to the supply connection of the CMOS gate, and not to the individual data inputs to the CMOS gate (e.g. the input 310), it is not always necessary for the control input 530 to track the input 310. This is a difference from the weak pullup circuit of FIG. 1, which does try to control the individual inputs, so requires a control signal for the pull-up that is low when the input is high, and therefore only works for gates where the required control signal can be provided. The circuit of FIG. 1 is not applicable to a NOR gate for example, whereas the circuit of the embodiment of the present invention shown in FIG. 5 is applicable to any CMOS gate.

When the input signal is a high value and the control input 530 therefore provides a high value to the third NMOS transistor 520, the third NMOS transistor 520 propagates the full ground voltage Gnd from the ground voltage supply 350 to the ground voltage supply input 355. This full ground voltage Gnd overrides the increased low signal being propagated through the third PMOS transistor 510. Thus, the signal on the control input 530 operates to select the third NMOS transistor 520 to provide the ground signal to the ground voltage supply input 355.

Since the input signal is a high value, the first PMOS transistor 330 is turned off and thus no current flows from the positive voltage supply 320 to the output 360. The first NMOS transistor 340 is turned on by the high value, thus the ground voltage supply 350 is connected to the output 360 and the output 360 is pulled down to Gnd. Therefore a full CMOS low signal is provided on the output 360 of the inverter 300.

When the input signal is an increased low value and the control input 530 therefore provides a low value to the third NMOS transistor 520, the third NMOS transistor 520 is turned off, thereby blocking the current from flowing through the third NMOS transistor 520. There is still a connection to the ground voltage supply 350 through the third PMOS transistor 510, however, since the gate of the third PMOS transistor 510 is connected to Gnd and the third PMOS transistor 510 is therefore always conducting. Recall that PMOS transistors cannot propagate a full low signal. The best a PMOS transistor can do is propagate an increased low signal, in this case $-V_{t(P2)}$, where $V_{t(P2)}$ is the threshold voltage of the third PMOS transistor 510 (PMOS transistors are normally quoted as having negative threshold voltages, so $-V_{t(P2)}$ is a positive value). This increased low signal is provided to the ground voltage supply input 355. Thus the signal on the control input 530 selects the third PMOS transistor 510 to provide the increased low signal to the ground voltage supply input 355.

The ground voltage supply input signal is an increased low value of $-V_{t(P2)}$, and the input signal from the input 310 is an increased low value of $-V_{t(pass)}$ (where $V_{t(pass)}$ is the threshold voltage of the device or devices through which the input signal is connected to the input 310, also a negative value for PMOS devices). Thus, assuming that the third PMOS transistor 510 is selected such that it has a threshold voltage substantially equivalent to the threshold voltage of the device or devices through which the input signal is connected to the input 310, the input signal and the ground voltage supply input signal are substantially the same voltage, the gate-source voltage across the first NMOS transistor 340 is therefore substantially zero, and the first NMOS transistor 340 is turned off. Exact equivalence between $V_{t(P2)}$ and $V_{t(pass)}$ is not necessary, as long as the gate-source voltage is sufficiently low to guarantee that negligible current flows through the first NMOS transistor 340. This condition is typically met if the gate-source voltage is less than ½ $V_{t(N1)}$. This equates to a requirement that $V_{t(P2)} - V_{t(pass)} <= ½ V_{t(N1)}$.

There is substantially no leakage current through the first NMOS transistor 340, even though the ground voltage supply 350 is providing a full Gnd voltage, because the full Gnd voltage signal was converted to the increased low signal by the third PMOS transistor 510. The increased low signal on the input 310 is still low enough to keep the gate-source voltage of the first PMOS transistor 330 below the threshold voltage, thereby turning it on, and the signal on the output 360 is thus pulled to $V_{dd}$. Therefore, a full CMOS high is provided on the output 360 of the inverter 300.

Figure 6:
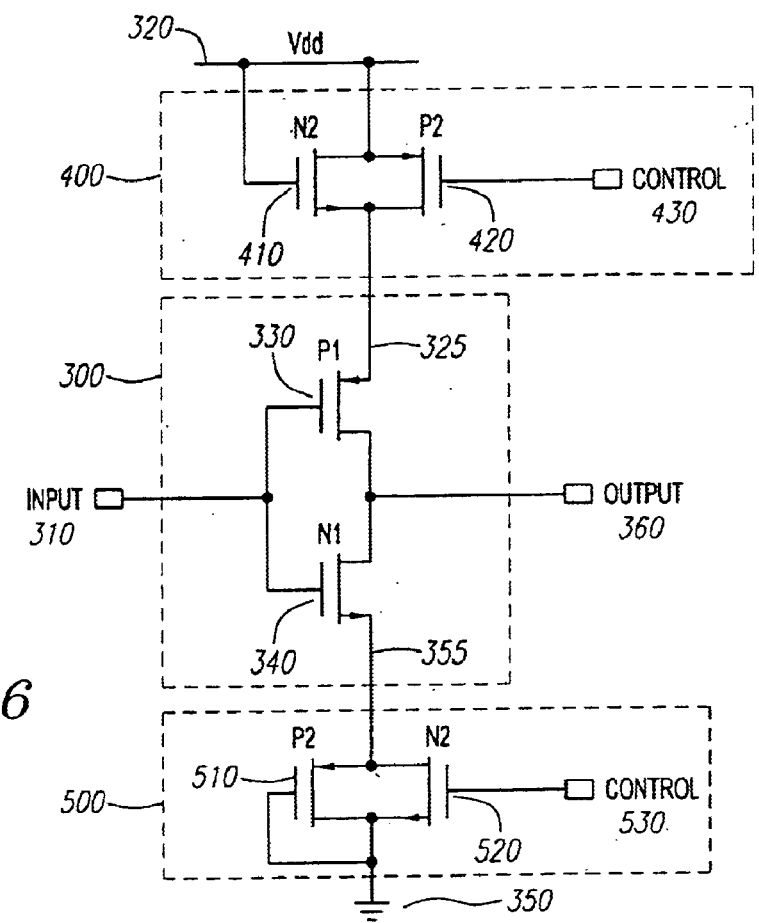
FIG. 6 is a depiction of a voltage modulation circuit connected to both the positive voltage supply input and the ground voltage supply input of the inverter of FIG. 3, according to a third embodiment of the invention.

The voltage modulation circuit 400 and the second voltage modulation circuit 500 can also be used in combination, to manage situations where the input 310 provides signals that do not reach either a high value or a low value. This combination is shown in FIG. 6.

Figure 7:
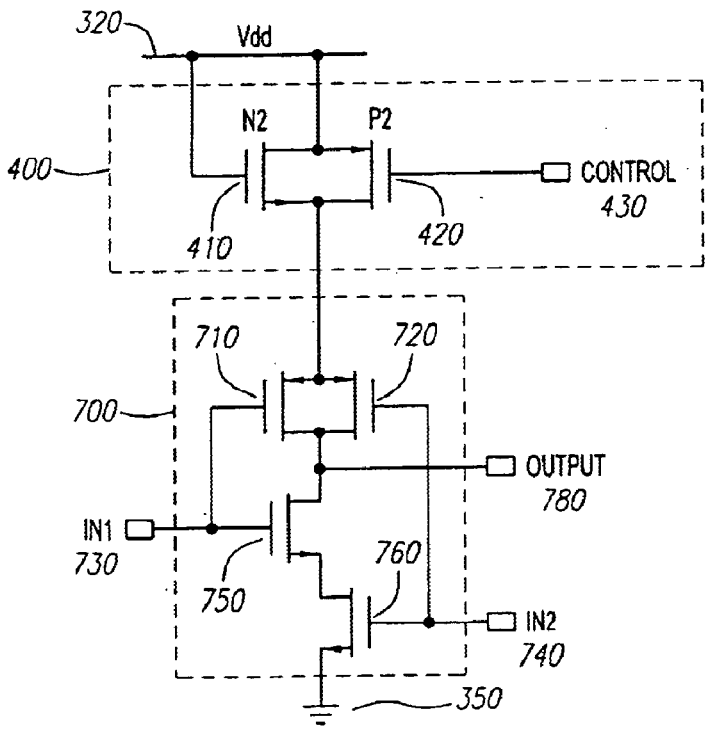
FIG. 7 is a depiction of a voltage modulation circuit connected to a CMOS NAND gate, according to an embodiment of the invention.

Either or both of the voltage modulation circuits 400, 500 can be used with any CMOS logic device. For example, FIG. 7 depicts the voltage modulation circuit 400 in use with a CMOS NAND gate 700. A NAND gate generates a high output signal whenever either input signal is low, and generates a low output signal when both input signals are high. Therefore, when either the first input 730 or the second input 740 provides a low signal, the corresponding PMOS transistor 710, 720 is turned on, allowing the voltage $V_{dd}$ to propagate from the positive voltage supply 320 through the second PMOS transistor 420, then through the PMOS transistor 710, 720 that was turned on, and on to the output 780. Since at least one of the inputs 730, 740 is providing a low signal, at least one of the corresponding NMOS transistors 750, 760 is turned off, thus blocking any current from flowing to the ground voltage supply 350. When both input signals are high, then both PMOS transistors 710, 720 are turned off, and both NMOS transistors 750, 760 are turned on. This causes the voltage $V_{dd}$ to be blocked and establishes a connection between the ground voltage supply 350 and the output 780, thus drawing the output signal to Gnd.

If both input signals are reduced high signals, then the control input 430 provides a high signal and the voltage modulation circuit 400 provides a reduced high signal, as discussed above, to the PMOS transistors 710, 720. The control signal on the control input 430 is the inverse of the output signal on the output 780, generated as discussed above. This prevents any significant current from leaking through the PMOS transistors 710, 720, thus saving power. Note that here as well the voltage modulation circuit 400 is placed along the already existing current path between $V_{dd}$ and Gnd, so no additional current paths are created. The reduced high signals on the inputs 730, 740 are sufficient to make the connection between the ground voltage supply 350 and the output 780, so the low signal is properly provided on the output 780.

Figure 8:
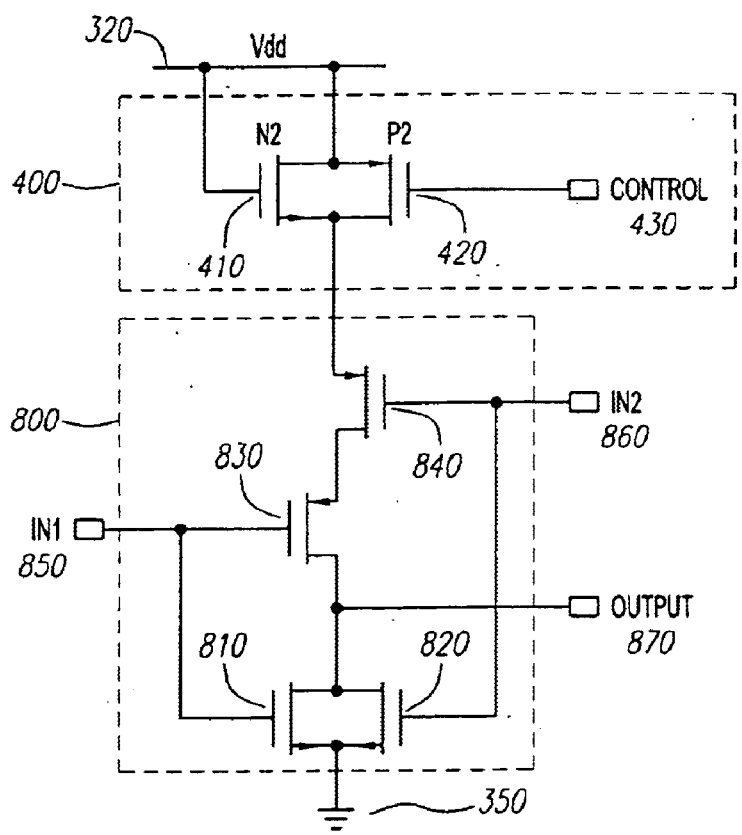
FIG. 8 is a depiction of a voltage modulation circuit connected to a CMOS NOR gate, according to an embodiment of the invention.

As another example, shown in FIG. 8, the voltage modulation circuit 400 is used with a CMOS NOR gate 800. A NOR gate generates a low output signal whenever either input signal is high, and generates a high output signal when both input signals are low. Therefore, when either the first input 850 or the second input 860 provides a high signal, the corresponding NMOS transistor 810, 820 is turned on, closing the connection from the ground voltage supply 350 to the output 870, and thus drawing the output 870 down to Gnd. Since at least one of the inputs 850, 860 is providing a high signal, then at least one of the corresponding PMOS transistors 830, 840 is turned off, thus blocking any current from flowing from the positive voltage supply 320. When both input signals are low, then both NMOS transistors 810, 820 are turned off, and both PMOS transistors 830, 840 are turned on. This causes the connection between the ground voltage supply 350 and the output 870 to be blocked, and makes the connection between the positive voltage supply 320 and the output 870, thus drawing the output signal to $V_{dd}$.

If either input signal is a reduced high signal, then the control input 430 provides a high value and the voltage modulation circuit 400 provides a reduced high signal, as discussed above, to the PMOS transistor 840. The control signal on the control input 430 is the inverse of the output signal on the output 870, generated as discussed above. This prevents any significant current from leaking through the PMOS transistor 840, thus saving power. Note that the voltage modulation circuit 400 is placed along the already existing current path between $V_{dd}$ and Gnd, so no additional current paths are created. The reduced high signals on the inputs 850, 860 are sufficient to make the connection between the ground voltage supply 350 and the output 870, so a low signal is properly provided on the output 870.

Figure 9:
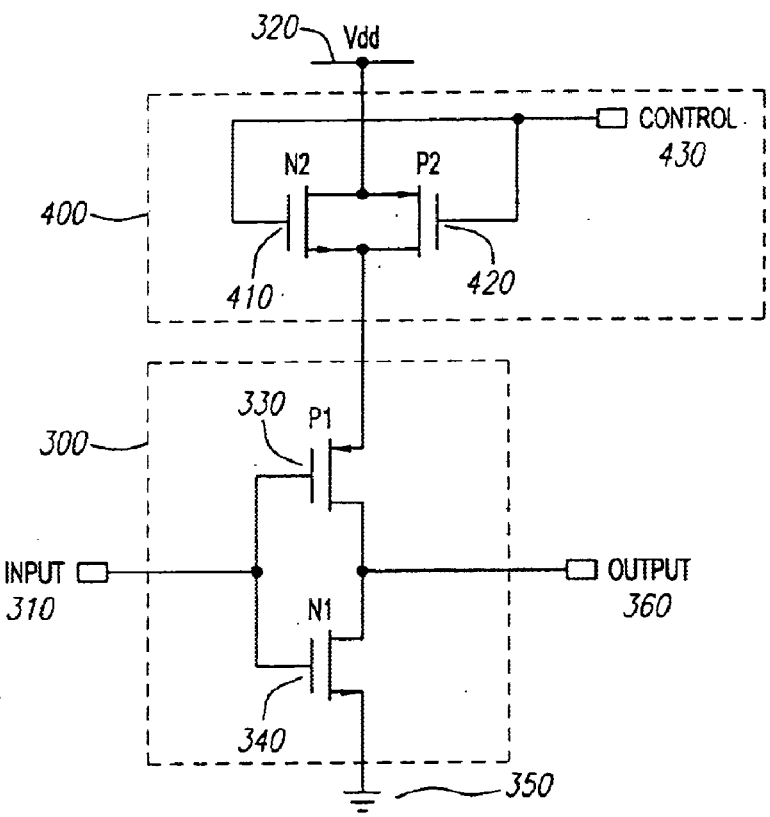
FIG. 9 is a depiction of a voltage modulation circuit having a control signal connected to both the converter and the bypass circuit, according to an embodiment of the invention.

Turning to FIG. 9, the control input 430 can alternatively be connected to the gates of both the second NMOS transistor 410 and the second PMOS transistor 420, as shown. This results in an increased capacitative load on the control input 430. Since transistor gates have an intrinsic capacitance, the capacitance is increased because there is a connection to an additional transistor gate. This layout, however, may be more compatible with certain silicon layout styles, such as those use in metal mask programmable gate arrays, which tend to arrange transistors in N/P pairs with their gates tied together.

Figure 10:
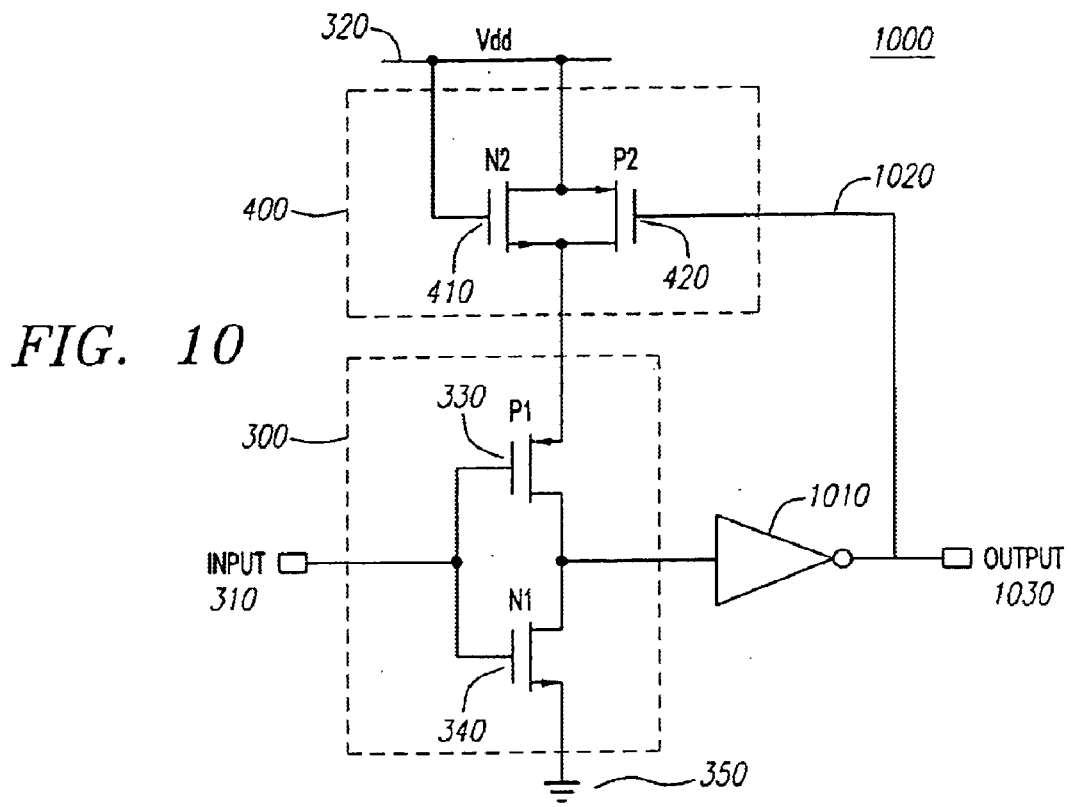
FIG. 10 is a depiction of a voltage modulation circuit which derives the control signal from the inverse of the output of the target circuit, according to an embodiment of the invention.

An advantage to the voltage modulation circuits 400, 500 described above, as compared with weak pull-up transistors, is that it is easier to choose device strengths for the voltage modulation circuits 400, 500, since the optimal device strength is not dependent on the resistance in the signal path coming in to the input 310. Turning to FIG. 10, a circuit 1000 similar to the circuit of FIG. 4 is shown, with the control signal being provided by the inverted output of the inverter 300, via the connection 1020 and an output inverter 1010.

In order for the circuit 1000 to function, a change in the input signal at input 310 needs to propagate to the output 1030. This in turn means that the output inverter 1010 has to be able to flip even if the control signal on the connection 1020 is in the wrong state. Since the control signal is derived from the output inverter 1010, there will be a non-zero propagation delay, such that the input to the output inverter 1010 will be high at the same time that the signal on the connection 1020 is high. Since the signal on the connection 1020 is high, the voltage modulation circuit 400 is only providing the reduced high signal $V_{dd}-V_{t(N2)}$ to the inverter 300. If the input 310 is low, then the inverter 300 will provide the reduced high signal to the output of the inverter 300, which is the input to the output inverter 1010. Therefore the output inverter 1010 needs to have a switching threshold voltage (the voltage at which the output inverter 1010 transitions from high to low) of less than $V_{dd}-V_{t(N2)}$ to ensure that the output inverter 1010 can flip under all possible circumstances. This is a constraint on the relative strengths of the devices in the output inverter 1010, and is not dependent on anything coming into the input 310.

The constraints on the strengths of the second NMOS transistor 410 and second PMOS transistor 420 are more relaxed than the constraints on the inverter 1010. If either transistor 410, 420 is made stronger or weaker than optimal, the circuit 1000 will operate at a slower speed, but it will still function properly. The constraints on the sizes of the transistors 410, 420 are similar to the constraints on any other transistor size in a logic circuit, and can be approached in the same manner. Those skilled in the art are readily able to appreciate these constraints and make appropriate choices as to the strengths of the transistors 410, 420. For the circuit of FIG. 10, choosing the second NMOS transistor 410 to be the same strength as the first NMOS transistor 340, and the second PMOS transistor 420 to be the same strength as the first PMOS transistor 330 typically results in a circuit that is functional and easy to make physically compact. (More generally for any logic device, selecting transistors for the voltage modulation circuit that are the same strength as those in the logic device will typically produce a functional result.)

As noted above the optimal size of the pull-up transistor 130 in FIG. 1 depends on the resistance of the circuit driving the input, which is a function of the path through the routing network that the signal has followed. In the voltage modulation circuit 400 the input 310 connects to the gates of the transistors 330, 340 forming the inverter 300 rather than to the source or drain of a transistor. Correct operation of the inverter 300 depends on its switching threshold lying between the maximum and minimum voltages that can be propagated through the routing network. These voltages are independent of the path that a signal might follow through the routing network, and therefore the required inverter threshold is independent of the input signal route. Similarly, the required threshold of the second NMOS transistor 410 also depends on the maximum voltage that propagates through the routing network, but is otherwise independent of the properties of that network.

A further consideration is the selection of the length of the second NMOS transistor 410. As discussed above, the leakage current through the first PMOS transistor 330 is dependent on the difference in the threshold voltage between the first NMOS transistor 410 and the devices connected to the input 310 (such as NMOS pass transistors in a routing network). It is desirable to have the threshold voltage of the first NMOS transistor 410 be higher than the threshold voltage of the devices connected to the input 310, in order to prevent leakage current from flowing across the first PMOS transistor 330. The higher that $V_{t(N2)}$ is, the lower the source voltage $V_{dd}-V_{t(N2)}$ of the first PMOS transistor 330 is, and the less likely that the gate voltage $V_{dd}-V_{t(pass)}$ (provided by the input 310) will be lower than the source voltage, and thus cause leakage.

Figure 11:
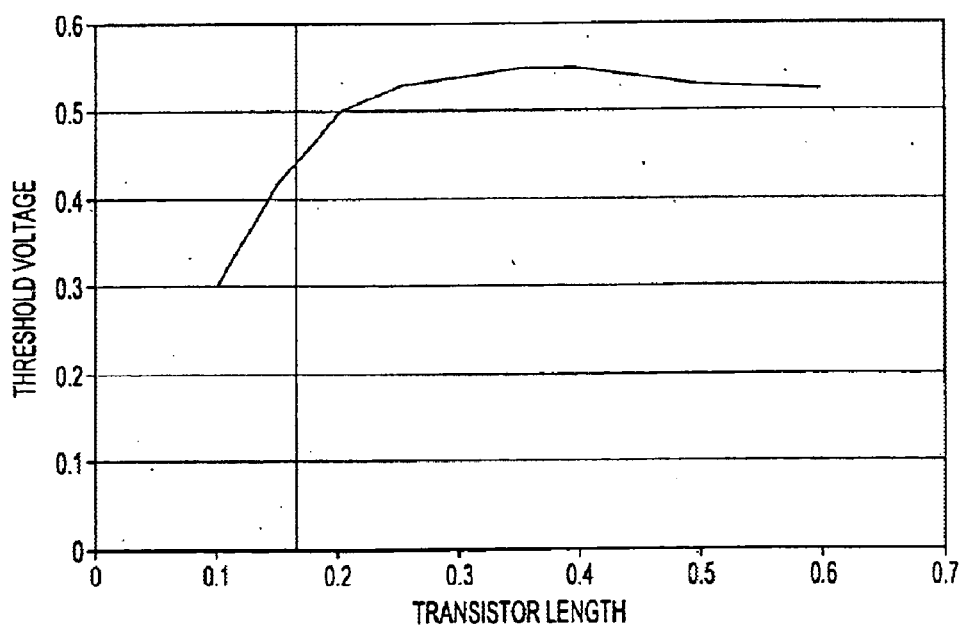
FIG. 11 is a graph of the relationship between the length of a transistor and the threshold voltage of the transistor.

For many CMOS processes, threshold voltage of a transistor is a function of transistor length. The graph of FIG. 11 shows an example of this function for an example CMOS process. The vertical line represents the minimum transistor length actually fabricated by the example CMOS process. In the region close to the minimum length, the threshold voltage increases steeply as the transistor length increases. The curve then levels off at about twice the minimum length, and eventually declines slightly. NMOS pass transistors such as those connected to the input 310 in some embodiments will typically be of minimum length. Therefore, by choosing the length of the second NMOS transistor 410 to correspond to a higher point on the threshold voltage curve, the risk of variations in the lengths of the pass transistors or other devices connected to the input 310 causing leakage is minimized, since the second NMOS transistor 410 is selected to have a relatively high threshold voltage.

In an alternate embodiment, the voltage degrading effects of the active devices in a configurable routing network are compensated for by providing a different voltage to the active devices than to the logic circuits. For example, with an NMOS pass transistor routing network a second high supply voltage is provided to the pass transistors, so that the gate voltage of the pass transistors is higher than the first high supply voltage $V_{dd}$ provided to the logic circuits. The first high supply voltage $V_{dd}$ may be set below the most positive allowable operating voltage for the circuit technology in order to achieve the required difference between the first and second high supply voltages. This second high supply voltage is provided to the gates of the pass transistors, so that the pass transistors can propagate a maximum voltage up to $V_{dd}$. Similarly, for PMOS pass transistor routing networks a second low supply voltage is provided to the pass transistors, which decreases the gate voltage of the pass transistors below the first low supply voltage Gnd provided to the logic circuits. The first low supply voltage Gnd may be set above the most negative allowable operating voltage for the circuit technology in order to achieve the required difference between the first and second low supply voltages. This second low supply voltage is provided to the gates of the pass transistors, to reduce the minimum voltage the pass transistors can propagate down to Gnd. A second high or low supply voltage routing network is provided, and level-shifting buffers may be provided on those signals that propagate between elements using the different supply voltages. For active devices that degrade both highs and lows, both the second high supply voltage and the second low supply voltage are provided.

Turning again to FIG. 12, the second supply voltage $V_{control}$ is provided on the control wires 50. The description so far has assumed that $V_{control}$ equals $V_{dd}$, in which case the NMOS pass transistors 40 can only propagate a reduced high signal of $V_{dd}-V_{t(pass)}$. In this alternative embodiment where the second supply voltage $V_{control}$ is not equal to $V_{dd}$, then the NMOS pass transistors 40 can propagate a high signal of $V_{control}-V_{t(pass)}$. If $V_{control}$ is chosen to be greater than or equal to $V_{dd}+V_{t(pass)}$, then the high signal propagated by the NMOS pass transistors can be as high as $V_{dd}$. Hence reconfigurable networks containing NMOS pass transistors can propagate undegraded high signals of $V_{dd}$ if $V_{control}$ is chosen to be greater than or equal to $V_{dd}+V_{t(pass)}$. Similarly, reconfigurable networks containing PMOS pass transistors, which have negative values of $V_{t(pass)}$, can propagate undegraded low signals of Gnd if the second supply voltage $V_{control}$ is chosen to be less than or equal to Gnd+$V_{t(pass)}$.

In the foregoing specification, the invention has been described with reference to specific embodiments thereof. It will, however, be evident that various modifications and changes may be made thereto without departing from the broader spirit and scope of the invention. For example, the reader is to understand that the specific composition and combination of components shown in the circuit diagrams described herein is merely illustrative, and the invention can be performed using different or additional components, or a different combination or composition of components. The specification and drawings are, accordingly, to be regarded in an illustrative rather than restrictive sense, and the invention is not to be restricted or limited except in accordance with the following claims and their legal equivalents.

We claim:

1. A reconfigurable device comprising:
    a plurality of processing devices, each comprising a processing device input and a processing device output;
    a configurable routing network; and
    a plurality of input buffer circuits situated between the configurable routing network and the processing device inputs, at least one input buffer circuit comprising a logic circuit and a voltage modulation circuit;
    wherein the configurable routing network provides a degraded voltage input signal to one or more of the input buffer circuits, and
    wherein the configurable routing network is configurable such that each processing device output drives more than one processing input, and wherein each processing device input is derivable by more than one processing device output.

2. The reconfigurable device of claim 1, wherein the configurable routing network comprises a plurality of pass transistors.

3. The reconfigurable device of claim 1, wherein the voltage modulation circuit is adapted to receive an undegraded supply voltage signal and provide an output supply voltage signal to the logic circuit, wherein the output supply voltage signal comprises either the undegraded supply voltage signal or a degraded supply voltage signal.

4. The reconfigurable device of claim 3, wherein the logic circuit comprises:
    a logic circuit input for receiving the degraded voltage input signal from the configurable routing network;
    a supply voltage input for receiving the ouput supply voltage signal from the voltage modulation circuit; and
    a logic circuit output;
    and wherein the first voltage modulation circuit comprises:
    a voltage modulation circuit input for receiving the undegraded supply voltage signal;
    a voltage modulation circuit output for providing the output supply voltage signal to the supply voltage input;
    a converter for converting the undegraded supply voltage signal to the degraded supply voltage signal and providing the degraded supply voltage signal to the voltage modulation circuit output;
    a bypass circuit for bypassing the converter and provide the undegraded supply voltage signal to the voltage modulation circuit output; and
    a control input for receiving a control signal for selecting between the converter and the bypass circuit for provision of the output supply voltage signal to the voltage modulation circuit output.

5. The reconfigurable device of claim 4, wherein the converter has a threshold voltage.

6. The reconfigurable device of claim 5, wherein the converter comprises a transistor.

7. The reconfigurable device of claim 6, wherein the transistor comprises a gate input and a drain input is connected to the gate input of the transistor.

8. The reconfigurable device of claim 6, wherein the transistor comprises a gate input and the voltage modulation circuit input is connected to the gate input.

9. The reconfigurable device of claim 6, wherein the transistor is a PMOS transistor.

10. The reconfigurable device of claim 6, wherein the transistor is an NMOS transistor.

11. The reconfigurable device of claim 5, wherein the converter comprises a diode.

12. The reconfigurable device of claim 4, wherein the bypass circuit comprises a transistor.

13. The reconfigurable device of claim 12, wherein the transistor comprises a gate input and the control input is connected to the gate input of the transistor.

14. The reconfigurable device of claim 12, wherein the transistor is a PMOS transistor.

15. The reconfigurable device of claim 12, wherein the transistor is an NMOS transistor.

16. The reconfigurable device of claim 4, wherein the undegraded supply voltage comprises a high value and the degraded supply voltage comprises a reduced high value, lower than the high value.

17. The reconfigurable device of claim 16, wherein the voltage modulation circuit is connected to a positive supply voltage, and the high value is substantially equal to the positive supply voltage.

18. The reconfigurable device of claim 16, wherein the high value comprises a CMOS high voltage.

19. The reconfigurable device of claim 16, wherein the configurable routing network comprises a device having a threshold voltage and the reduced high value is substantially equal to the high value minus the absolute value of the threshold voltage.

20. The reconfigurable device of claim 4, wherein the undegraded supply voltage comprises a low value and the degraded supply voltage comprises an increased low value, higher than the low value.

21. The configurable device of claim 20, further comprising a second voltage modulation circuit, wherein the second modulation circuit is connected to a ground voltage, and the low value is substantially equal to the ground voltage.

22. The reconfigurable device of claim 20, wherein the low value comprises a voltage representing a logic '0'.

23. The reconfigurable device of claim 20, wherein the configurable routing network comprises a device having a threshold voltage and the increased low value is substantially equal to the low valve plus the absolute value of the threshold voltage.

24. The reconfigurable device of claim 1, wherein the at least one input buffer circuit is connected to a positive supply voltage and a ground voltage and wherein the voltage modulation circuit is connected to the logic circuit without creating any additional current paths between the positive supply voltage and the ground voltage.

25. The reconfigurable device of claim 4, wherein the control signal is based on an output signal provided on the logic circuit output.

26. The reconfigurable device of claim 25, wherein the control signal is equal to the inverse of the output signal.

27. The reconfigurable device of claim 4, wherein the voltage modulation circuit output is connected to the supply voltage input to allow current to flow from the voltage modulation circuit output to the supply voltage input.

28. The reconfigurable device of claim 27, wherein the voltage modulation circuit output is connected to the supply voltage input to allow current to flow from the voltage modulation circuit input to the logic circuit output.

29. The configurable device of claim 4, further comprising a second voltage modulation circuit, wherein the second modulation circuit is adapted to receive a second undegraded supply volume signal and provide a second output supply voltage signal to the logic circuit, wherein the second output supply voltage signal comprises either the second undegraded supply voltage signal or a second degraded supply voltage signal.

30. The reconfigurable device of claim 29, wherein the logic circuit further comprises a second supply voltage input for receiving the second output supply voltage signal, and wherein the voltage modulation circuit further comprises:

a second voltage modulation circuit input for receiving the second undegraded supply voltage signal;

a second voltage modulation circuit output for providing the second output supply voltage signal to the second supply voltage input;

a second converter for converting the second undegraded supply voltage signal to the second degraded supply voltage and provide the second degraded supply voltage signal to the second voltage modulation circuit output;

a second bypass circuit for bypassing the second converter and provide the second undegraded supply voltage signal to the second voltage modulation circuit output; and a second control input for receiving a second control signal for selecting between the second converter and the second bypass circuit for provision of the second output supply voltage signal to the second voltage modulation circuit output.

31. A reconfigurable device comprising:

a plurality of processing devices, each comprising a processing device input and a processing device output; and a configurable routing network;

wherein the configurable routing network comprises a plurality of active devices, wherein the plurality of processing devices receive a first supply voltage, wherein the plurality of active devices receive a second supply voltage different than the first supply voltage, and wherein the configurable routing network is configurable such that each processing device output can drive more than one processing device input, and wherein each processing device input can be driven by more than one processing device output.

32. The reconfigurable device of claim 31, wherein at least one of the plurality of active devices has a threshold voltage, wherein the first supply voltage comprises a positive supply voltage and the second supply voltage is greater than or substantially equal to the first supply voltage plus the threshold voltage.

33. The reconfigurable device of claim 32, wherein at least one of the active devices is an NMOS transistor.

34. The reconfigurable device of claim 31, wherein at least one of the active devices is a PMOS transistor.

35. The reconfigurable device of claim 31, wherein at least one of the active devices is a pass transistor.

36. The reconfigurable device of claim 31, wherein each of the plurality of processing devices receives the first supply voltage from an input buffer circuit.

* * * * *

UNITED STATES PATENT AND TRADEMARK OFFICE
CERTIFICATE OF CORRECTION

PATENT NO. : 6,859,084 B2
DATED : February 22, 2005
INVENTOR(S) : Anthony I. Stansfield et al.

It is certified that error appears in the above-identified patent and that said Letters Patent is hereby corrected as shown below:

Column 12,
Line 61, between the words "the" and "NMOS" delete the word "first" and insert the word -- second --.
Line 64, before the word "NMOS" delete the word "first" and insert the word -- second --.

Column 14,
Line 21, between the words "a" and "voltage" insert the word -- first --.
Line 28, between the words "is" and "by" delete the word "derivable" and insert therefor the word -- drivable --.
Line 34, before the word "voltage", insert the word -- first --.
Line 44, between the words "the" and "voltage" insert the word -- first --.

Column 15,
Line 27, before the word "voltage", insert the word -- first --.
Line 54, between the words "the" and "voltage", insert the word -- first --.

Column 16,
Line 12, between the words "the" and "voltage" insert the word -- second --.

Signed and Sealed this

Fourteenth Day of June, 2005

JON W. DUDAS
*Director of the United States Patent and Trademark Office*